United States Patent
Kukreja et al.

(10) Patent No.: US 10,120,026 B2
(45) Date of Patent: Nov. 6, 2018

(54) ON-CHIP TEST PATTERN GENERATION

(71) Applicant: Lantiq Beteiligungs-GmbH & Co. KG, Neubiberg (DE)

(72) Inventors: Himanshu Kukreja, Singapore (SG); Shakil Ahmad, Singapore (SG)

(73) Assignee: Lantiq Beteiligungs-GmbH & Co. KG, Neubiberg (DE)

( * ) Notice: Subject to any disclaimer, the term of this patent is extended or adjusted under 35 U.S.C. 154(b) by 75 days.

(21) Appl. No.: 15/287,331

(22) Filed: Oct. 6, 2016

(65) Prior Publication Data

US 2017/0102431 A1  Apr. 13, 2017

(30) Foreign Application Priority Data

Oct. 7, 2015 (EP) ..................... 15188790

(51) Int. Cl.
*G01R 31/00* (2006.01)
*G01R 31/3185* (2006.01)
*G01R 31/3187* (2006.01)

(52) U.S. Cl.
CPC . *G01R 31/318536* (2013.01); *G01R 31/3187* (2013.01); *G01R 31/318547* (2013.01); *G01R 31/318594* (2013.01)

(58) Field of Classification Search
CPC ................ G01R 31/318536; G01R 31/318594
See application file for complete search history.

(56) References Cited

U.S. PATENT DOCUMENTS

| | | | |
|---|---|---|---|
| 5,570,375 A | 10/1996 | Tsai et al. | |
| 6,574,763 B1* | 6/2003 | Bertin | G01R 31/287 324/750.05 |
| 6,675,338 B1* | 1/2004 | Golshan | G01R 31/318547 714/739 |
| 6,700,399 B1* | 3/2004 | Savithri | H01L 22/34 324/750.3 |
| 7,109,738 B2* | 9/2006 | Savithri | G01R 31/2831 324/750.3 |
| 7,120,842 B2* | 10/2006 | Barevadia | G01R 31/318577 714/726 |
| 7,348,595 B2* | 3/2008 | Takeoka | G01R 31/318538 257/48 |
| 7,353,440 B2* | 4/2008 | Ohwada | G01R 31/318547 714/726 |
| 7,644,333 B2* | 1/2010 | Hill | G01R 31/318547 714/726 |
| 8,140,923 B2* | 3/2012 | Goel | G01R 31/31922 702/108 |
| 8,694,276 B2* | 4/2014 | Sontakke | G01R 31/31917 324/750.03 |

(Continued)

OTHER PUBLICATIONS

European Search Report, Application No. EP15188790.8, dated Apr. 15, 2016.

*Primary Examiner* — Esaw T Abraham
(74) *Attorney, Agent, or Firm* — Eschweiler & Potashnik, LLC

(57) ABSTRACT

A chip is provided that includes an integrated circuit including a plurality of logic elements, wherein the plurality of logic elements is configured to form, in a test mode, a plurality of scan chains. The chip further includes an on-chip signal generator connected with the integrated circuit and configured to provide, in the test mode, a test pattern signal to the plurality of scan chains.

10 Claims, 4 Drawing Sheets

(56) References Cited

U.S. PATENT DOCUMENTS

| | | | |
|---|---|---|---|
| 9,547,043 B2* | 1/2017 | Ahmed | G01R 31/318547 |
| 2002/0174393 A1* | 11/2002 | Udawatta | G01R 31/318536 714/726 |
| 2003/0126532 A1 | 7/2003 | Huch et al. | |
| 2003/0149913 A1* | 8/2003 | Balachandran | G01R 31/318577 714/30 |

* cited by examiner

ON-CHIP TEST PATTERN GENERATION

CROSS REFERENCE TO RELATED APPLICATIONS

This application claims priority to European Application number EP 15 188 790.8, filed on Oct. 7, 2015, the contents of which are herein incorporated by reference in its entirety.

FIELD

Various embodiments relate to a chip comprising an on-chip signal generator configured to provide, in a test mode, a test pattern signal to a plurality of scan chains formed by a plurality of logic elements. Various embodiments relate to a burn-in oven and a method.

BACKGROUND

To test an integrated circuit (IC), it is known to subject logic elements of the IC to a stress test. E.g., the chip comprising the IC can be placed in a burn-in oven where environmental conditions can be controlled. E.g., an elevated temperature can be applied.

In reference implementations, an Automated Test Pattern Generation (ATPG) pattern signal which is loaded into the burn-in oven and, fed to IC via scan pins, to the logic elements. The ATPG signal is a pseudorandom test pattern which intends to toggle all or at least a majority of the logic elements between the available states. To facilitate toggling, a test mode can be triggered which effects logical interconnections between the logic elements subject to the test; the logical interconnections enable a series of logic elements to act as a shift register (scan chain) where different clocked states of the ATPG signal iteratively toggle the logic elements of a scan chain. Then, the states of the logic elements of the scan chains may be read out and compared to expected values. Thereby, failure or wear-out of the hardware elements forming the logic elements, e.g., of the transistors, can be detected.

However, such scenarios face certain restrictions and drawbacks. E.g., there may be limited space available in the burn-in oven to store ATPG patterns. On the other hand, it may be required to provide the ATPG signal having a comparably large number of input pins to ensure that almost all or all logic elements are toggled. This requires significant efforts in signal routing which may be complex due to the limited space available.

SUMMARY

Therefore, a need exists for advanced techniques of test pattern generation for a test mode. In particular, a need exists for such techniques which enable the test mode with reduced signal routing requirements.

This need is met by the features of the independent claims. The dependent claims define embodiments.

According to an aspect, a chip is provided. The chip comprises an IC. The IC comprises a plurality of logic elements. In a test mode, the plurality of logic elements is configured to form a plurality of scan chains. The chip further comprises an on-chip signal generator connected with the chains. In the test mode, the signal generator is configured to provide a test pattern signal to the plurality of scan chains.

According to an aspect, a burn-in system is provided. The burn-in system comprises a burn-in oven and a receptacle. The receptacle is arranged is configured to releasably mount a chip according to a further aspect. The burn-in system further comprises an IEEE Test Access Port Connector configured to trigger a test mode.

According to an aspect, a method is provided. The method comprises a plurality of logic elements of an IC forming, in a test mode, a plurality of scan chains. The method further comprises an on-chip signal generator providing, in the test mode, a test pattern signal to the plurality of scan chains.

It is to be understood that the features mentioned above and features yet to be explained below can be used not only in the respective combinations indicated, but also in other combinations or in isolation, without departing from the scope of the present disclosure. Features of the above-mentioned aspects and embodiments may be combined with each other in other embodiments.

BRIEF DESCRIPTION OF THE DRAWINGS

The foregoing and additional features and effects of the disclosure will become apparent from the following detailed description when read in conjunction with the accompanying drawings, in which like reference numerals refer to like elements.

DETAILED DESCRIPTION

Figure 1:
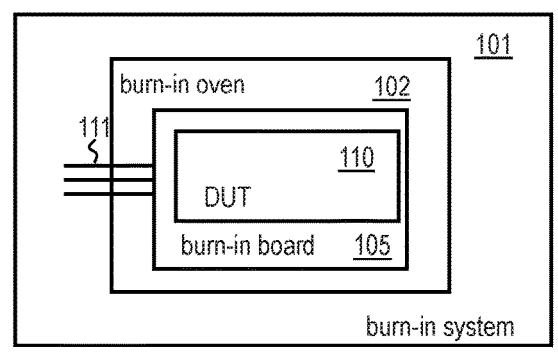
FIG. 1 schematically illustrates a burn-in system comprising a burn-in oven.

In the following, embodiments of the disclosure will be described in detail with reference to the accompanying drawings. It is to be understood that the following description of embodiments is not to be taken in a limiting sense. The scope of the disclosure is not intended to be limited by the embodiments described hereinafter or by the drawings, which are taken to be illustrative only.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Hereinafter, techniques of on-chip test pattern signal generation are explained. These techniques may facilitate on-chip ATPG. These techniques may be applied for burn-in exercises of an IC.

According to embodiments, a chip is provided. The chip comprises an IC. The IC comprises a plurality of logic elements. In a test mode, the plurality of logic elements is configured to form a plurality of scan chains. The chip further comprises an on-chip signal generator connected with the IC. In the test mode, the signal generator is configured to provide a test pattern signal to the plurality of scan chains.

Each one of the plurality of logic elements may be formed by one or more transistors, e.g., implemented in CMOS technology. As such, due to manufacturing spread, etc., some of the transistors may be subject to failure. Hereinafter, techniques are illustrated which enable to identify failing transistors and, thus, failing logic elements in a convenient and yet reliable manner. Techniques are illustrated which enable to test combinational and sequential logic. Connectivity, open, shorts, and resistivity between the logic elements may be tested.

The scan chains may form shift registers. The scan chains may form logical interconnections in-between the various logic elements. In some scenarios, each one of the plurality of logic elements may be part of a single scan chain. Hereinafter, for illustrative purposes, reference is made primarily to the logic elements being implemented by flip flops. However, in various scenarios, respective techniques may be readily applied to different kinds and types of logic elements, e.g., including sequential logic such as flip flops and combinational logic such as gates, multiplexers, etc.

The scan chains may facilitate toggling each one of the plurality of logic elements. E.g., toggling may occur in a clocked manner. For this, a clock signal may be employed. For each cycle, the test pattern signal may indicate a different codeword. The number of codewords of the test pattern signal is sometimes referred to as cycle length. The cycle length may be larger than a length of the codeword. E.g., there may be more than 100.000 cycles, or more than 1.000.000 cycles, or more than 10.000.000 cycles. E.g., the codeword may have a length of less than 10, or less than 100 bit. Each position of the codeword is associated with one of the plurality of scan chains. For each cycle, the current value of the respective position of the codeword is fed to an entry point of the respective scan chain.

The IC may be selected from the group comprising: an analogue transceiver stage; a digital transceiver stage; a Gigabit Passive Optical Network (GPON) IC; a Central Office (CO) IC; a Customer Premises Equipment (CPE) IC; a sensor; a wireless transceiver; etc. The IC may comprise elements selected from the group comprising: a processor; a working memory; a non-volatile memory. The IC may comprise digital, analogue and/or mixed digital-analogue elements. The IC may comprise radio frequency (RF) functionality. In particular, the IC may relate to Internet of Things (IoT) and/or Connected Home applications. The IC may comprise more than 100.000 transistors, preferably more than 1.000.000 transistors. The IC may form a system-on-a-chip (SOC).

The on-chip signal generator may thus be formed on the same die as the IC. There may be routing provided in between the signal generator and the IC. In some scenarios, the signal generator may be provided in the same package as the IC. The signal generator may also be provided in a different package than the IC. The signal generator may be comparably limited in complexity. E.g., the signal generator may comprise less than 100.000 transistors, preferably less than 1.000 transistors, more preferably less than 500 transistors. Thereby, a cost effective implementation of the signal generator becomes possible.

By providing the on-chip signal generator, it is not required to provision external routing of the test pattern signal during the test mode. In scenarios where restricted space is available for external routing, this can facilitate execution of the test mode.

The test mode may enable testing of functionality of the IC prior to placing the IC in service. The specific type of the test mode that can be implemented by the test pattern signal is not germane for the functioning of the signal generator. Various types and kinds of test modes may be employed. In the various scenarios disclosed herein, a specific test mode of relevance is the burn-in test mode.

FIG. 1 illustrates aspects with respect to a burn-in exercise of the plurality of flip flops. A burn-in system 101 comprises a burn-in oven 102 which, according to reference implementations, has wiring 111 routed from the exterior to its interior. The burn-in oven has limited dimensions. In the interior of the burn-in oven, a device under test (DUT) such as a chip 110 comprising an IC is mounted by a receptacle (not shown in FIG. 1).

Connecting the wiring 111 with respective scan control pins of the chip 110 can be time-consuming and cumbersome. The time for setting up the test (test setup time) can be long.

According to various scenarios as disclosed herein, various scenarios enable to greatly reduce the test setup time. Only a comparably smaller number of wiring typically needs to be connected with the chip 110 according to various scenarios disclosed herein.

In various scenarios disclosed herein, it may only be required to connect wiring corresponding to an Institute of Electrical and Electronics Engineers (IEEE) 1149.1 test access port (TAP) connector, as specified by the Joint Test Action Group (JTAG). It may not be required to connect wiring corresponding to an ATPG test signal externally generated.

After setup of the test is completed and when executing the burn-in test, a defined temperature or temperature profile is applied in the interior of the burn-in oven 102 for a test time. During the test time, the various flip flops of the chip 110 are toggled. A failure-rate curve describing the number of finally failing flip flops as a function of operation time can thus be sampled in accelerated time lapse. Weak devices thus tend to finally fail during the test time.

Figure 2:
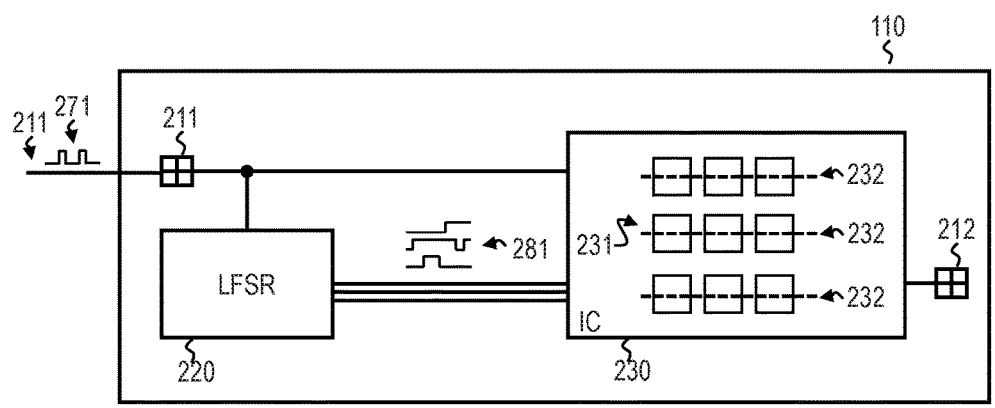
FIG. 2 schematically illustrates a chip according to various embodiments, the chip comprising an on-chip signal generator coupled with an IC of the chip.

FIG. 2 illustrates aspects of an on-chip signal generator 220. In general, various types of signal generators may be employed. E.g., a single flip flop may be employed in combination with a feedback branch and one or more inverters arranged in output branches. Hereinafter, various scenarios will be described with respect to the signal generator being implemented as a linear feedback shift register (LFSR). However, in all scenarios disclosed herein it is possible to replace the LFSR by another suitable type of signal generator.

In the scenario of FIG. 2, the signal generator 220 is implemented by the LFSR. The LFSR 220 is connected with the IC 230. The IC 230 comprises a plurality of flip flops 231. Because the IC 230, as depicted in FIG. 2, is operated in the test mode, the flip flops 231 form scan chains 232.

In the scenario of FIG. 2, three, M=3, scan chains are formed by the plurality of flip flops 231. This is illustrative only and a smaller or larger number of scan chains 232 may be formed. The number of scan chains 232 is not germane for the functioning of the techniques according to various scenarios disclosed herein. E.g., in examples there may be 285 scan chains.

Figure 3:
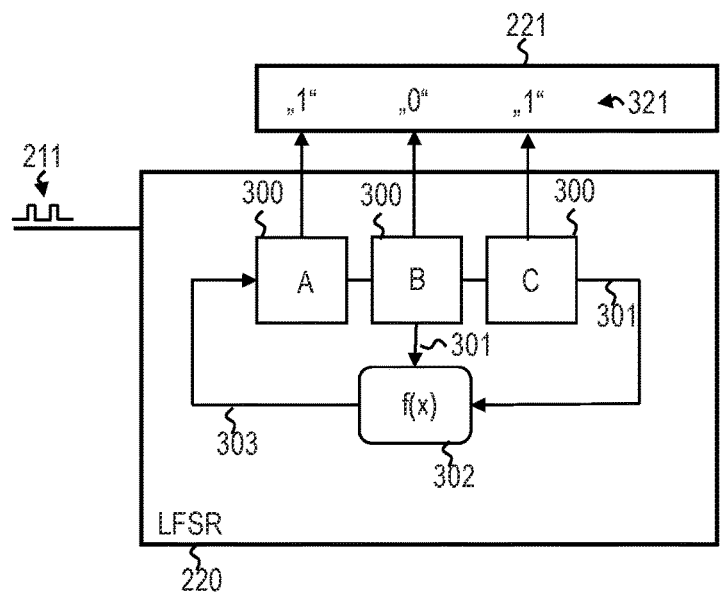
FIG. 3 schematically illustrates details of the signal generator of FIG. 2 which is implemented as a linear feedback shift register according to various embodiments.

The LFSR 220 outputs a test pattern signal 281. Referring to FIG. 3, the test pattern signal 281 comprises—for each cycle of a clock signal 271 received via a respective external pin 211—a respective codeword 321. Different cycles correspond generally to different codewords 321. In other words, the LFSR 220 is configured to output different states of the test pattern signal 281 depending on the clock signal 271.

The codeword 321 comprises an entry for each one of the scan chains 232. Thus, in the scenario of FIGS. 2 and 3, the codeword 321 has a length three, N=3. As can be seen, M=N. This enables to test all different kinds of combinations of states of the various flip flops 231. This facilitates an effective stress test.

FIG. 3 illustrates aspects of the LFSR 220 in greater detail. The LFSR 220 comprises three flip flops 300 (labelled "A", "B", and "C" in FIG. 3), feedback branches 301, a converter 302 which is configured to convert the signals obtained via the feedback branches based on a linear function to obtain a transformed feedback signal, and a further feedback branch 303 configured to provide the transformed feedback signal to an input of the first flip flop 300. The state of each flip flop 300 is associated with an entry of the codeword 321. The LFSR 220 provides the test pattern signal in a pseudorandom fashion depending on a seed which is used to initialize the LFSR 220. After some cycle length, the codewords 321 are repeated.

Again referring to FIG. 2, e.g., the pin 211 may be an external test mode pin. E.g., the pin 211 may be part of the TAP connector. E.g., the pin 211 may be the TAP Test Clock (TCK) pin. In other scenarios, the pin 211 may be a proprietary pin.

E.g., the wiring 211 may be connected to the various external pins disclosed herein via a burn-in board 105 comprising one or more sockets for one or more chips, or via a needle card, or via wire bonds or the like. The various external pins may comprise a metallic pad that is accessible from the outside. E.g., the metallic pad may have dimensions of more than 50 µm×50 µm. E.g., the burn-in board 105 may have limited dimensions due to the limited dimensions of the burn-in oven.

The clock signal 271 is also provided to the IC 230. Depending on the test pattern signal 281 and further depending on the clock signal 271, the flip flops 231 toggle through different states. Here, the scan chains 232 may function as shift registers such that a particular state of the flip flops 231 propagates through the scan chains 232 as the clock signal 271 advances. During read-out, the states of the various flip flops 231 can be retrieved. Typically, read-out is not required to take place in the burn-in oven 102.

Figure 4:
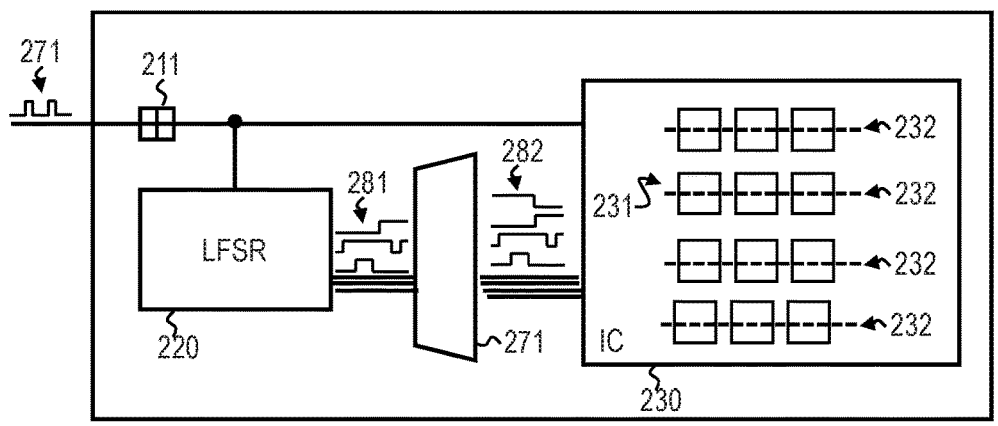
FIG. 4 schematically illustrates a chip according to various embodiments, the chip comprising an on-chip signal generator coupled with an IC of the chip and further comprising a decompressor coupled in-between the signal generator and the IC.

FIG. 4 illustrates aspects regarding the length of the codeword 321 of the test pattern signal 281. In the scenario of FIG. 4, there is—for illustrative purposes—a number of M=4 four scan chains 323. Yet, the codeword 321 has a length of N=3 three. Thus, N<M. The chip 110 further comprises a decompressor 271 configured to translate the (compressed) test pattern signal 281 into a decompressed test pattern signal 282 which has a longer codeword length. In particular, the decompressed test pattern signal 282 has a codeword length equalling the number M=4 of scan chains 232. By configuring the LFSR 220 to output a codeword 321 of comparably small length, a simpler and cost-effective implementation of the LFSR 220 becomes possible. E.g., in an example there may be M=285 scan chains 232 and the codeword length of the compressed test pattern signal 281 may be N=6; the codeword length of the uncompressed test pattern signal 282 may be 285 as well.

A decompressor may be provided in the various scenarios as disclosed herein, albeit not specifically mentioned. The decompressor may facilitate the read-out.

Figure 5:
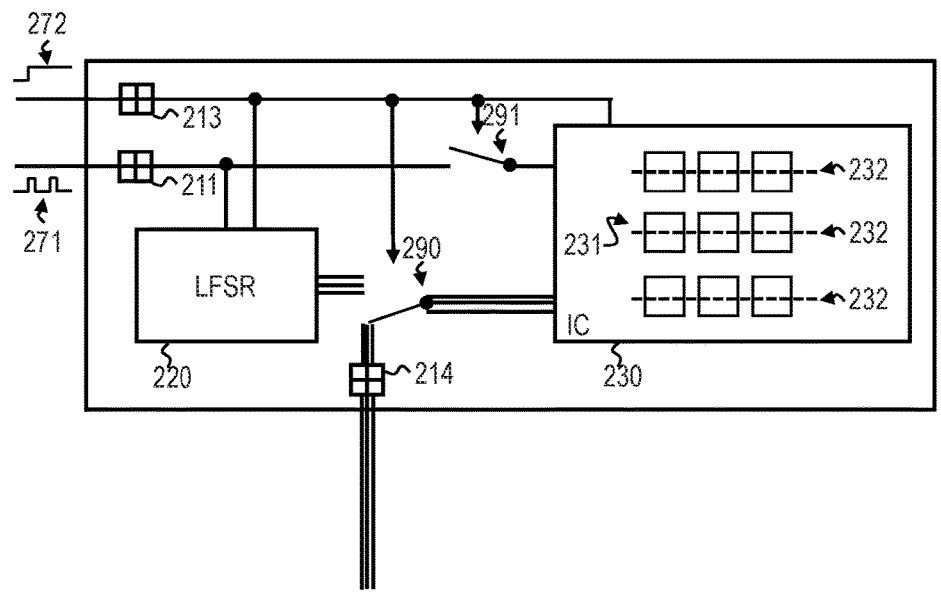
FIG. 5 schematically illustrates a chip according to various embodiments, the chip comprising an on-chip signal generator coupled with an IC of the chip, wherein the chip comprises a switch and a plurality of external scan control pins.

FIG. 5 illustrates aspect with respect to selectively enabling the test mode. In FIG. 5, an external test mode pin 213 is provided. The external test mode pin 213 is connected with the LFSR 220 and the IC 230. Via the external test mode pin 213, a setup signal 271 may be received. E.g., the external test mode pin 213 may be part of the TAP. E.g., the external test mode pin 213 may be the Test Mode Select (TMS) pin of the TAP.

The setup signal 271 may trigger the test mode. Once the setup signal 271 indicates that the test mode is triggered, one or more of the following actions may be taken:

E.g., the LFSR 220 may be initialized, e.g., by specifying the seed. The flip flops 231 may be configured to form the scan chains 232. In FIG. 5, a switch 291 is provided. The switch 291 can be controlled by the setup signal 271. If the setup signal 281 indicates the test mode, the switch may connect the external clock pin 211 with the IC 230, i.e., with the scan chains 232 and the flip flops 231. In other modes—different to the test mode—the switch 291 may disconnect the external clock pin 211 from the IC 230. E.g., during normal operation or during a further test mode, the switch 291 may disconnect the external clock pin 211 from the IC 230.

By means of the setup signal 271, it becomes possible to selectively operate the IC 230 in the test mode during device testing. Normal operation is not inhibited.

The chip 110 also comprises a further switch 290, e.g., implemented by a multiplexer. The further switch 290 is configured to selectively connect the LFSR 220 with the IC 230. The further switch 290 may be controlled at least by the setup signal 272. In particular, the further switch 290 is configured to connect the LFSR 220 with the IC 230 in the test mode; and to disconnect the LFSR 220 from the IC 230 in a further mode different to the test mode.

FIG. 5 also illustrates aspects with respect to a further test mode. Sometimes, it may be desirable to enable one or more further test modes. In particular, it may be desirable that the further test modes do not rely on the LFSR 220.

E.g., the further switch 290 can be optionally configured to connect a plurality of external scan control pins 214 (for simplicity, in FIG. 5 only a single external scan control pin 214 is graphically illustrated) in a further test mode with the IC 230. It may be possible to write and/or read out data from the plurality of flip flops 231 via the plurality of external scan control pins 214. E.g., a further test pattern signal may be provided to the scan chains 232 via the plurality of external scan control pins 214. E.g., a further clock signal may be provided to the plurality of scan chains 232 via the external scan control pins 214; e.g., each one of the plurality of flip flops 231 may be configured to toggle through different states depending on the further clock signal and further depending on the further test pattern signal. E.g., after the burn-in test has finished, it may be possible to read out data from the plurality of flip flops 231 via the plurality of external scan control pins 214, thereby testing whether all flip flops 231 are responding or whether some of the flip flops 231 have failed. E.g., a respective compressor and/or decompressor may be provided with respect to data communicated via the plurality of external scan control pins 214.

The external scan control pins 214 may be provided in the various scenarios as disclosed herein, albeit not specifically mentioned.

The external scan control pins 214 facilitate execution of various further tests, beyond the test mode implemented by the LFSR 220.

Typically, to enable testing of various kinds, the scan chains 232 are required to be formed by the flip flops 231. This may be done by setting a "SCAN_ENABLE" port of the IC 230 to ONE.

Figure 6:
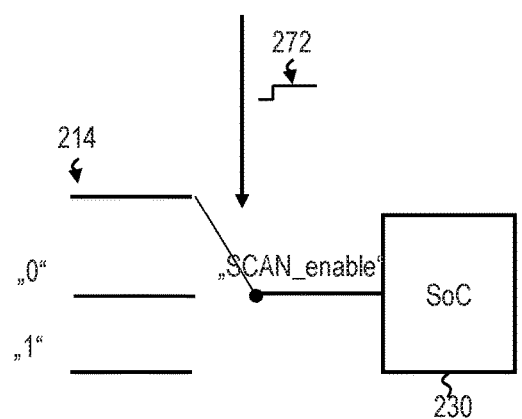
FIG. 6 schematically illustrates the switch of FIG. 5 in greater detail.

FIG. 6 illustrates detailed aspects with respect to forming the scan chains 232. Depending on the setup signal 272, a switch applies either a logical "ONE", "ZERO" to the "SCAN_ENABLE" port. E.g., if the setup signal 272 indicates the test mode, then the "ONE" may be applied and the scan chains 232 may be formed. If the setup signal 272 indicates normal operation, then the "ZERO" may be applied. If the setup signal 272 indicates the further test mode, then connection with at least one of the plurality of external scan control pins 214 may be established. Then, the formation of the scan chains 232 may be selectively triggered via the respective at least one of the plurality of external scan control pins 214. E.g., the switch of FIG. 6 may be implemented as multiplexer.

Figure 7:
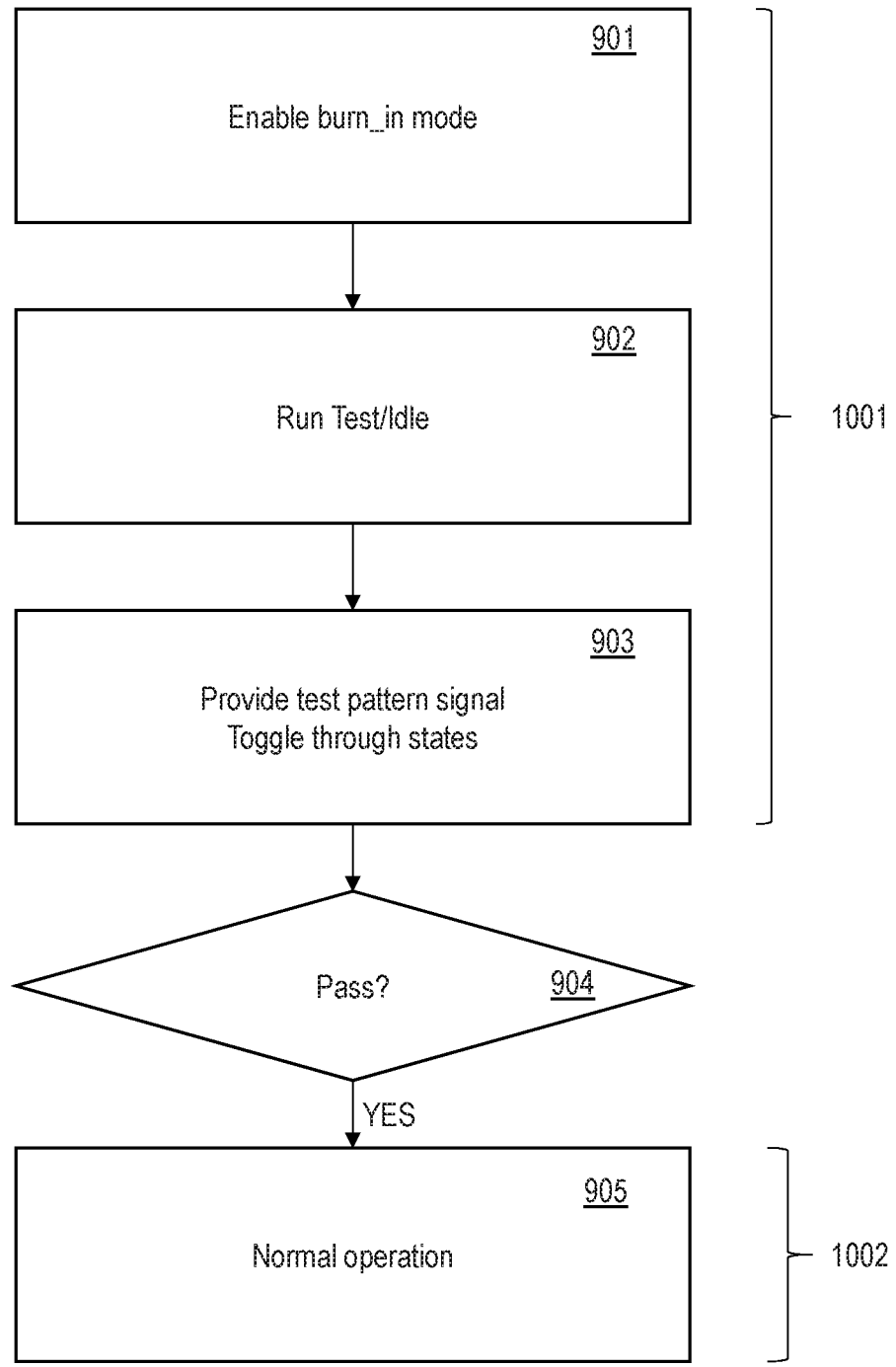
FIG. 7 is a flowchart of a method according to various embodiments.

FIG. 7 is a flowchart of a method according to various embodiments. First, the test mode—in the scenario of FIG. 7 the burn-in mode—is enabled, 901. For this, the burn-in board 105 may be employed to contact the chip 110 in the burn-in oven 102. Then, the setup signal 272 may indicate a respective value. The setup signal 272 may be provided employing the JTAG TAP within the IEEE JTAG framework and may be provided via the burn-in board 105. Here, the LFSR 220 may be initialized with a respective seed. The clock signal 271 may be provided to the IC 230.

Next, 902, the IEEE JTAG state machine is brought to state run test/idle; this step is optional and may be particularly relevant in the IEEE JTAG framework.

Then, the LFSR 220 provides the test pattern signal 281, 903. This may be done via the TCK pin of the JTAG TAP. This causes the various flip flops 231 being toggled into different states. This may occur at elevated temperature within the burn-in oven 102. The scan chains 232 function as shift registers. 903 may be executed for a predefined test time to trigger ageing and wear out of the various transistors of the IC 230.

901-903 all contribute to the burn-in test mode 1001.

Then, it is checked whether some of the flip flops 231 failed due to the burn-in test, 904. This may be done by reading out data via the plurality of scan control pins 214, e.g., outside the burn-in oven 102. E.g., in some scenarios the state of the flip flops 231 forming the scan chains 232 after the burn-in test has finished may be read out. I.e., it may be possible to test the impact of the stress test of 903.

If the check 904 passes, the chip 110 may be released for normal operation 1002, 905.

Summarizing, above techniques have been illustrated which enable to reduce the scan setup time. A test pattern signal is not required to be externally fed to a chip, but is rather generated on-chip. A LFSR may be employed for generating the test pattern signal.

Although the disclosure has been shown and described with respect to certain embodiments, equivalents and modifications will occur to others skilled in the art upon the reading and understanding of the specification. The present disclosure includes all such equivalents and modifications and is limited only by the scope of the appended claims.

The invention claimed is:

1. A chip, comprising:
an integrated circuit comprising a plurality of logic elements, wherein the plurality of logic elements is configured to form, in a test mode, a plurality of scan chains, and
an on-chip signal generator connected with the integrated circuit and configured to provide, in the test mode, a test pattern signal to the plurality of scan chains,
wherein the on-chip signal generator is configured to provide the test pattern signal having a codeword length N, and
wherein plurality of logic elements is configured to form M scan chains,
wherein N is smaller than M, and
wherein the chip further comprises a decompressor configured to translate the test pattern signal having the codeword length of N into a decompressed test pattern signal having a codeword length of M, or
wherein the on-chip signal generator is configured to provide the test pattern signal having a codeword length of N,
wherein the plurality of logic elements is configured to form M scan chains, and
wherein N equals M.

2. The chip of claim 1,
wherein the on-chip signal generator comprises a linear feedback shift register.

3. The chip of claim 1, wherein the on-chip signal generator comprises less than 100,000 transistors.

4. The chip of claim 1, further comprising:
an external test mode pin connected with the on-chip signal generator and the integrated circuit,
wherein the on-chip signal generator is configured to initialize in response to receiving a setup signal via the external test mode pin, and
wherein the plurality of logic elements is configured to form the scan chains in response to receiving the setup signal via the external test mode pin.

5. The chip of claim 4, further comprising:
an external clock pin connected with the on-chip signal generator and selectively connected with the integrated circuit,
wherein the on-chip signal generator is configured to provide different states of the test pattern signal depending on a clock signal received via the external clock pin,
wherein each one of the plurality of logic elements is configured to toggle through different states depending on the clock signal and the test pattern signal, and
wherein an IEEE Test Access Port comprises the external clock pin and the external test mode pin.

6. The chip of claim 1,
wherein the test mode is a burn-in exercise of the plurality of flip-flops.

7. A chip, comprising:
an integrated circuit comprising a plurality of logic elements, wherein the plurality of logic elements is configured to form, in a test mode, a plurality of scan chains, and
an on-chip signal generator connected with the integrated circuit and configured to provide, in the test mode, a test pattern signal to the plurality of scan chains;
an external clock pin connected with the signal generator and selectively connected with the integrated circuit, wherein the on-chip signal generator is configured to provide different states of the test pattern signal depending on a clock signal received via the external clock pin, and wherein each one of the plurality of logic elements is configured to toggle through different states depending on the clock signal and the test pattern signal.

8. The chip of claim 7, further comprising:

at least one switch configured to connect, in the test mode, the external clock pin with the integrated circuit and configured to disconnect, in a further mode different to the test mode, the external clock pin from the integrated circuit.

9. A chip, comprising:

an integrated circuit comprising a plurality of logic elements, wherein the plurality of logic elements is configured to form, in a test mode, a plurality of scan chains, and an on-chip signal generator connected with the integrated circuit and configured to provide, in the test mode, a test pattern signal to the plurality of scan chains;

a plurality of external scan control pins selectively connected with the integrated circuit, and at least one switch configured to disconnect, in the test mode, the plurality of external scan control pins from the plurality of scan chains, wherein the at least one switch is configured to connect, in a further mode other than the test mode, the plurality of external scan control pins to the plurality of scan chains.

10. The chip of claim 9, wherein the plurality of external scan control pins is further configured to provide a further clock signal to the plurality of scan chains, and wherein each one of the plurality of logic elements is configured to toggle through different states depending on the further clock signal and the further test pattern signal.

\* \* \* \* \*